(12) United States Patent
Karpinski et al.

(10) Patent No.: US 8,097,117 B2
(45) Date of Patent: Jan. 17, 2012

(54) METHOD OF PRODUCING SOLAR MODULES BY THE ROLLER LAMINATE PROCESS

(75) Inventors: Andreas Karpinski, Odenthal (DE); Bernhard Koll, St. Augustin (DE)

(73) Assignee: Kuraray Europe GmbH, Frankfurt (DE)

( * ) Notice: Subject to any disclaimer, the term of this patent is extended or adjusted under 35 U.S.C. 154(b) by 330 days.

(21) Appl. No.: 12/023,598

(22) Filed: Jan. 31, 2008

(65) Prior Publication Data

US 2008/0185096 A1     Aug. 7, 2008

Related U.S. Application Data

(60) Provisional application No. 60/901,681, filed on Feb. 16, 2007.

(30) Foreign Application Priority Data

Feb. 1, 2007  (DE) .................... 10 2007 005 845

(51) Int. Cl.
*H01L 31/18* (2006.01)
*H01L 21/02* (2006.01)

(52) U.S. Cl. ...................... 156/306.3; 438/64

(58) Field of Classification Search ........ 156/308.2, 156/555, 103–104; 438/64
See application file for complete search history.

(56) References Cited

U.S. PATENT DOCUMENTS

| | | | |
|---|---|---|---|
| 4,717,790 A | | 1/1988 | Gochermann |
| 4,946,523 A * | | 8/1990 | Meussner ............ 156/64 |
| 6,077,374 A * | | 6/2000 | Hopfe ................ 156/102 |
| 6,160,215 A | | 12/2000 | Curtin |
| 6,340,403 B1 * | | 1/2002 | Carey et al. ......... 156/182 |
| 6,660,566 B2 | | 12/2003 | Masayuki |
| 6,933,051 B2 * | | 8/2005 | Fleming et al. ...... 428/463 |
| 7,143,800 B2 * | | 12/2006 | Chick ................ 156/499 |
| 2003/0029493 A1 * | | 2/2003 | Plessing ............. 136/251 |
| 2003/0075210 A1 * | | 4/2003 | Stollwerck et al. .... 136/243 |
| 2005/0115667 A1 | | 6/2005 | Yokoyama |
| 2005/0284516 A1 | | 12/2005 | Koll |

FOREIGN PATENT DOCUMENTS

| | | |
|---|---|---|
| DE | 3538986 C2 | 11/1989 |
| DE | 4026165 C2 | 8/1992 |
| DE | 4227860 A1 | 4/1993 |
| DE | 19951444 A1 * | 4/2001 |
| DE | 19732217 C2 | 12/2002 |
| EP | 1617487 A2 | 1/2006 |
| WO | WO 02/103809 A1 | 12/2002 |

* cited by examiner

*Primary Examiner* — Katarzyna Wyrozebski Lee
*Assistant Examiner* — Daniel Lee
(74) *Attorney, Agent, or Firm* — Millen, White, Zelano & Branigan, P.C.

(57) ABSTRACT

The invention relates to a method of producing a solar module by laminating a layer body consisting of a first carrier, to which at least one solar cell unit is applied, and a second carrier by at least one intermediate film based on a plasticizer-containing polyvinyl acetal by guiding the layer body between at least one pair of rollers at a temperature of 50 to 150° C.

18 Claims, 2 Drawing Sheets

METHOD OF PRODUCING SOLAR MODULES BY THE ROLLER LAMINATE PROCESS

This application claims the benefit of the filing date of U.S. Provisional Application Ser. No. 60/901,681 filed Feb. 16, 2007, which is incorporated by reference herein.

TECHNICAL FIELD

The invention relates to the production of thin-film solar modules by the roller laminate process using a polyvinyl butyral (PVB)-based film.

STATE OF THE ART

Thin-film solar modules usually consist of a photosensitive semiconductor film (referred to below as a solar cell unit), which is applied to a mainly transparent plate, e.g. by vaporization, gas-phase deposition, sputtering or wet separation, and is provided to offer protection against outside influences with a likewise transparent cover where necessary. The solar cell units are frequently laminated between a pane of glass and a cover plate, e.g. made from glass with the help of an optionally transparent adhesive. The adhesive must completely enclose the solar cell units, be UV-stable and completely bubble-free after the laminating process.

Hardening casting resins or cross-linkable, ethylene vinyl acetate (EVA)-based systems are frequently used as transparent adhesives, as disclosed in DE 41 22 721 C1 or DE 41 28 766 A1, for example. These adhesive systems may be adjusted to have such a low viscosity in the unhardened state that they cover the solar cell units bubble-free. Once a hardener or cross-linking agent has been added, a mechanically resistant adhesive layer is obtained. The disadvantage of such solar modules is their high manufacturing cost; particularly in the case of large-dimension façade elements, the embedding of the solar cell units in the liquid casting resin and the controlled hardening thereof is a process that is hard to monitor. In addition, some casting resins have a tendency to bubble or delaminate after a few years.

An alternative to hardening adhesive systems is the use of polyvinyl butyral (PVB)-based films. In this case, the solar cell units are covered with one or several PVB films and these are combined with the required covering materials at high pressure and high temperature to produce a laminate. Methods of manufacturing solar modules with the aid of PVB films are disclosed, for example, by DE 40 26 165 C2, DE 42 278 60 A1, DE 29 237 70 C2, DE 35 38 986 C2, DE 197 32 217, DE 40 26 165, U.S. Pat. No. 6,160,215, WO 02/103809, U.S. Pat. No. 6,660,556, US 2005/0115667 or U.S. Pat. No. 4,321,418. In these publications, the PVB film is used to embed crystalline solar cell units; single-layer systems for thin-film solar modules or else the manufacturing method suitable for these are not described.

The use of PVB films as laminated glazing in solar modules is disclosed, for example, in DE 20 302 045 U1, EP 1617487 A1 and DE 35 389 86 C2. These specifications likewise relate to the encapsulation of solar cells between two PVB films.

In the case of thin-film solar modules, the solar cells are applied straight onto a carrier, such as a pane of glass or a flexible polymer or metal carrier. Depending on the configuration in the carrier, encapsulation of the solar cells is not possible. In addition, thin-film solar modules may be manufactured in any size and in large quantities. The known methods of producing solar modules, which have solar cells embedded between PVB films, cannot be sufficiently automated to produce a laminate with thin-film solar modules on an industrial scale.

Furthermore, DE 35 38 986 C2 and DE 42 27 860 disclose the production of solar modules by a lamination process at increased temperature and pressure. The use of a pair of rollers to this end is not described.

OBJECT

The object of this invention is therefore to provide a method of producing thin-film solar modules using thermoplastic intermediate films, which facilitates continuous and/or automatable production.

Surprisingly, it was found that a laminating process with a pair of rollers is suitable for the lamination of mechanically unstable solar cells too.

DESCRIPTION OF THE INVENTION

The object of this invention is therefore a method of producing a solar module by laminating a layer body consisting of a first carrier, to which at least one solar cell unit is applied, and a second carrier by at least one intermediate film based on a plasticiser-containing polyvinyl acetal by pressing the layer body between at least one pair of rollers at a temperature of 50 to 150° C., particularly 60 to 150° C.

Line pressures of 0.5 N/mm to 100 N/mm, particularly 10 N/mm to 50 N/mm, are preferably applied at the presses. Line pressure denotes the surface pressure of the pair of rollers relative to the film width.

In order to prevent the cover plates from being destroyed, the line pressure at the front and/or rear edge of the layer body (at the beginning and end of the laminate) may be reduced to the dead weight of the upper pressing rollers or reduced to zero by removing the upper pressing rollers.

In addition, if there are imperfections in the layer body, such as electrical contacts or conductor paths, it may be necessary for the transport speed of the layer body through the roller press to be reduced, so that the line pressure has a longer time to take effect. In this way, improved air removal and adhesion of the imperfection to the polyvinyl acetal is achieved.

BRIEF DESCRIPTION OF THE DRAWINGS

Various other features and attendant advantages of the present invention will be more fully appreciated as the same becomes better understood when considered in conjunction with the accompanying drawings, wherein:

FIG. 1 shows the schematic design of a suitable plant with two pairs of rollers.

Figure 1:
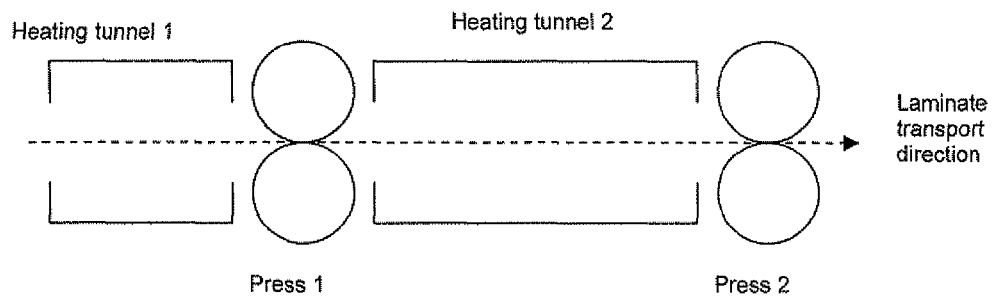
FIG. 1 is a schematic design of a suitable plant with two pairs of rollers.

The process according to the invention is carried out using one or several, preferably two presses, each consisting of a pair of pressing rollers. In this case, the layer body is pressed between at least one pair of rollers with the same or a different line pressure and at the same or a different temperature.

Plants of this sort are known for the production of laminated glazing and usually have at least one heating tunnel to raise the temperature or ensure a constant temperature before and after the first press in plants with two presses. It is also conceivable that processing should take place in plants with at least one heating tunnel to raise or ensure a constant temperature downstream of the last press, or plants equipped with more than two presses each with heating tunnels upstream.

The aforementioned temperatures relate at least to the layer body before the last pair of rollers that has to be passed through. It is optionally possible to insert additional pairs of rollers, either with or without a heating zone upstream, before the last pair of rollers, wherein in this case the layer body may display the aforementioned temperatures or also lower temperatures than 50° C. or 60° C.

In accordance with the invention, the layer bodies are heated before being pressed in the heating tunnel, e.g. using IR, microwave irradiation or convection to temperatures of 50° C. or 60° C. to 150° C., respectively, preferably 70° C. or 80° C. to 100° C., respectively. The temperature of the laminates may be measured, e.g. using a contactless radiation pyrometer.

The film based on a plasticiser-containing polyvinyl acetal preferably contains non-cross-linked polyvinyl butyral (PVB), which is obtained by acetalizing polyvinyl alcohol with butyraldehyde.

The use of cross-linked polyvinyl acetals, particularly cross-linked polyvinyl butyral (PVB), is likewise possible. Suitable cross-linked polyvinyl acetals are described, for example, in EP 1527107 B1 and WO 2004/063231 A1 (thermal self-cross-linkage of polyvinyl acetals containing carboxyl groups), EP 1606325 A1 (polyvinyl acetals cross-linked with polyaldehydes) and WO 03/020776 A1 (polyvinyl acetals cross-linked with glyoxylic acid). Full reference is made to the disclosure of these patent applications.

It is also possible to carry out the acetalization with other or additional aldehydes, e.g. those with 5-10 carbon atoms, such as valeraldehyde for instance.

The polyvinyl alcohols needed in order to produce the polyvinyl acetals may also be terpolymers made from hydrolyzed vinyl acetate/ethylene copolymers within the framework of this invention. These compounds are usually over 98% hydrolysed and contain 1 to 10% by wt ethylene-based units (e.g. "Exceval" type from Kuraray Europe GmbH). The acetalization may take place as for polyvinyl alcohol.

Suitable films based on the aforementioned polyvinyl acetals, particularly PVB, contain in addition to 50-85% by wt or 50-80% by wt polyvinyl acetal, 50-20% by wt or 50-15% by wt plasticiser and small quantities of adhesion regulators, anti-blocking agents and UV stabilisers. Films of this sort are abbreviated below to PVB films. The principle manufacture and composition of PVB films for laminated safety glass is described, for example, in EP 185 863 B1, EP 1 118 258 B1 or WO 02/102591 A1.

In a special embodiment of the present invention, the solar module has sound-damping properties, wherein at least one of the films has sound insulating properties. PVB-based sound insulating films are described in e.g. EP 1 118 258 B1 or EP 387 148 B1, to which disclosure full reference is made here. Sound insulating films in accordance with EP 1 118 258 B1 increase the sound-damping of laminated safety glass in its coincidence frequency in the range from 1,000 to 3,500 Hz by at least 2 dB, measured according to DIN EN ISO 717.

The thickness of the films based on plasticiser-containing polyvinyl acetal is preferably around the standard industrial thicknesses for these films, such as 0.38, 0.51, 0.76, 1.14, 1.52 or 2.28 mm.

The film based on plasticiser-containing polyvinyl acetal has surface structure preferably applied to one side or particularly preferably to both sides, with a roughness of Rz>35 µm and Rz<180 µm, preferably Rz>50 µm and Rz<150 µm, particularly preferably Rz>70 µm and Rz<130 µm and particularly of Rz>90 µm and Rz<130 µm. If the surface roughness Rz is below 35 µm, at the temperature needed in order for the material to flow round the conductor paths or other fittings the edges of the laminate close prematurely, before the air has been completely pressed out. The result of this is air pockets (bubbles) in the middle of the laminate. If there is excessive surface roughness (Rz>180 µm), the energy required in order to melt off the roughness peaks increases and the process becomes unacceptably long.

The surface structure of the film may be produced by extrusion through the so-called flow or melt fracture process immediately before the plastic melts emerge from the extrusion nozzle in accordance with EP 0 185 863 B1. Different roughness levels may be produced by varying the outlet die gap and the nozzle lip temperatures right at the nozzle outlet. This method produces an irregular, almost isotropic roughness. The roughness measurement in this case is virtually identical measured in all directions, although the individual elevations and depressions are irregular in their height and distribution.

Alternatively, the film's surface structure may be applied by embossing, e.g. in accordance with EP 06112163 or EP 06112159. In this case, a uniform roughness/roughness structure is produced on the surface.

The surface roughness Rz or roughness value Rz is measured according to DIN EN ISO 4287. The measurements indicated were taken using a Mahr model S2 roughness measuring unit, feed device PGK with mechanical single-stage pushbutton MFW-250.

The pressed body may then be exposed to a greater or lower pressure and a higher temperature in each case. This may take place in accordance with the known autoclave, vacuum ring or vacuum bag processes, e.g. in accordance with EP 1 235 683 B1.

In the case of the vacuum bag process, the pressed layer body is placed in a plastic or rubber bag. This is then hermetically sealed and provided with a vacuum valve, preferably in the middle of the pane. Where large-dimensioned bodies are concerned, two vacuum valves may also be provided. Using a vacuum pump, a vacuum of under 200 mbar is first created and evacuation takes place for at least 5 mins at room temperature. The sandwich is then heated to 140° C. in a circulating air cabinet, while retaining the vacuum. The heating rate during this is 4 to 6° C./min, depending on the heat output, so that the holding temperature of 140° C. is achieved after 20 to 30 mins. The temperature is then held at 140° C. for 30 mins. The temperature must then be lowered to min. 60° C., before the vacuum can be removed. In practice, the pressed body is exposed to a reduced pressure of between 0.01 and 300 mbar and a temperature of between 100 and 200° C.

Alternatively, autoclave processes may be used. Those skilled in the art will be familiar with these from the production of laminated glass. They are carried out at a higher pressure of approx. 7 to 15 bar and at temperatures of 130 to 145° C. for 10 to 120 minutes.

The films that can be used according to the invention must cover or enclose the solar cell units and their electrical connections positively and bubble-free; at the same time, the smallest possible overall thickness is required for the solar modules. In order to achieve this, it is advisable for the films to "yield" to the solar cell units and their electrical connections under the production conditions, i.e. display a certain flowing ability under the laminating conditions.

The capacity of polyvinyl acetal-based films to adhere to glass can be set through the addition of adhesion regulators, such as e.g. the alkaline and/or alkaline earth salts of organic acids disclosed in WO 03/033583 A1. Potassium acetate and/or magnesium acetate have proved particularly suitable. In order to obtain high adhesion values, it may be necessary to use films without the addition of adhesion regulators such as alkaline and/or alkaline earth salts.

The first and/or second carrier of the solar module according to the invention may consist of glass, plastic or metal or laminates of these, wherein at least one of the carriers must be transparent. It is likewise possible for one or both carriers to be in the form of laminated glass (i.e. a laminate made from at least two panes of glass and at least one film) or insulating glass with a gas space in between. Naturally, it is also possible to combine these measures.

Figure 3:
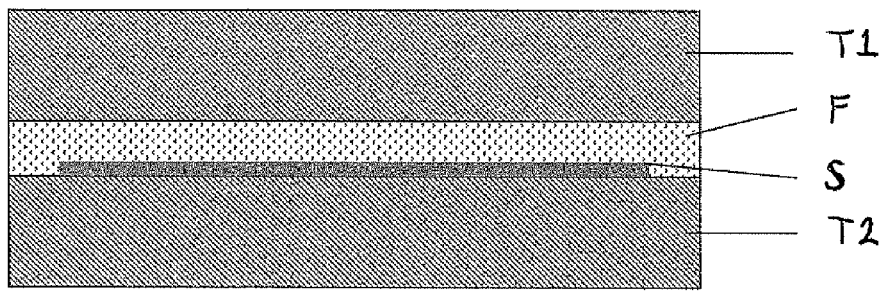
FIGS. 3-5 are each schematic designs of laminates produced according to the invention.
Figure 4:
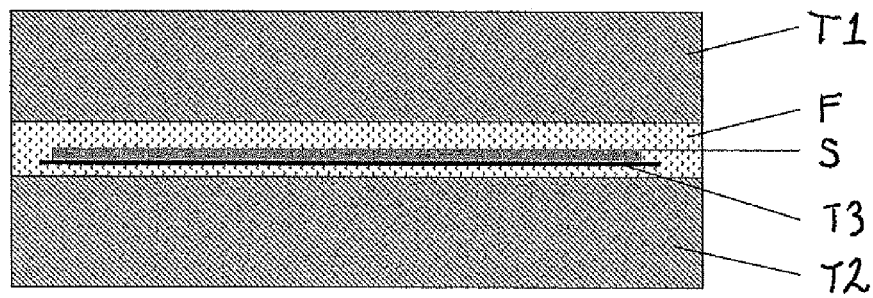
Figure 5:
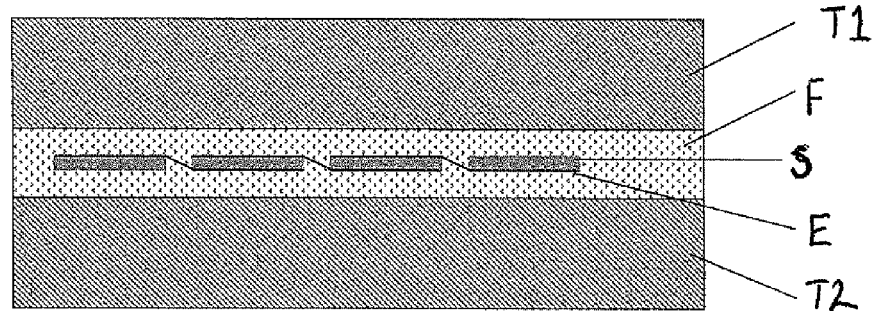

It is also possible to apply the solar cell units to a first, particularly a flexible carrier, and to press this between two layers made from plasticiser-containing polyvinyl acetal and two, preferably transparent, carriers. FIGS. 3 to 5 each show a schematic design of laminates produced according to the invention, wherein T1, T2 and T3 stand for the carrier materials, F for a film or layer of plasticiser-containing polyvinyl acetal, S for the solar cells and E for any electrical contact that may be necessary between the individual solar cells. In FIGS. 3 and 4, the solar cells or photoactive layers are applied to carrier materials, whereby in the variant shown in FIG. 4 a flexible carrier T3 is preferably used.

The solar cells used in the solar modules need not have any special properties. Crystalline or amorphous, inorganic or organic semiconductor systems may be used, which are applied to the first carrier. In order to supply an adequate voltage, several solar cells may be electrically interconnected. The thickness of the solar cells, also referred to as the functional layer in the case of thin-film models, is at least 0.1 μm. The thickness of the conductor paths required for the electrical connection of the solar cells is usually >50 μm.

Figure 2:
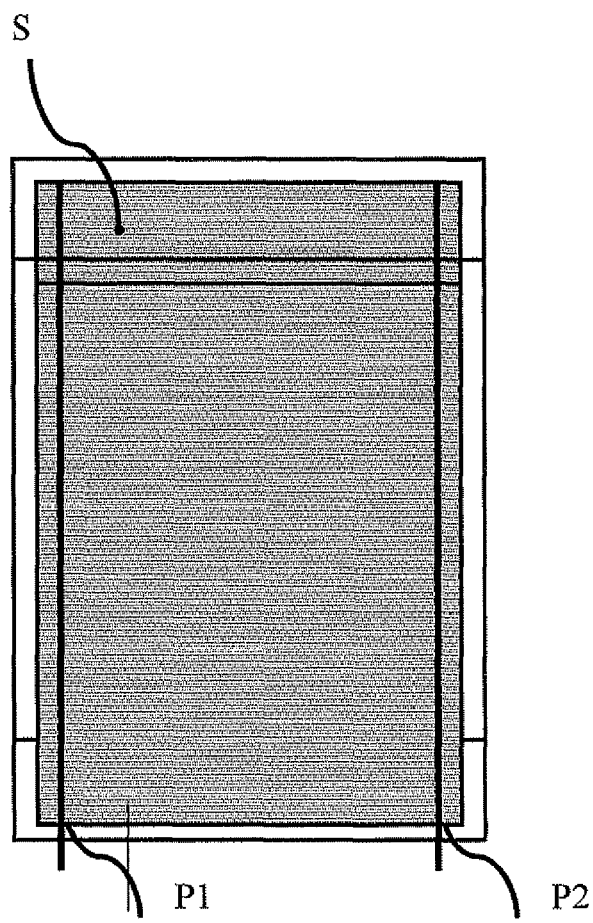
FIG. 2 is a schematic design of a solar module ion.

FIG. 2 shows a schematic design of a solar module, wherein S stands for the solar cells and P for the conductor paths.

Solar modules produced in accordance with the invention may also be used as façade elements, roof surfaces, conservatory covering, sound-proofing walls, balconies or balustrade elements or as window components.

EXAMPLE

A thin-film module measuring L 30 cm×B 20 cm with a glass thickness of 3.2 mm and two longitudinal conductor paths each 20 mm from the edge with a width of 2 mm and a thickness of approx. 250 μm was pressed in a plant according to FIG. 1 at a temperature (after the last press) of 90° C. and a line pressure of 35 N/mm in each case and a feed speed of 3 m/min. The running direction of the laminate was chosen such that the point at which the conductor paths left the module was at the back and pressed last. A Trosifol HR 100-type film (Kuraray Europe GmbH) with a roughness Rz of approx. 100 μm was used as the plasticiser-containing polyvinyl acetal film.

The line pressure of the presses was reduced over the first 10 mm and the last 30 mm of the film body to the dead weight of the upper rollers.

Bubble-free laminates with low clouding were obtained.

It was possible to remove the clouding completely in a subsequent autoclave process at 140° C. and 12 bar with a holding time of 30 minutes.

Instead of the autoclave process, the clouding can also be removed in a vacuum process at 145° C. and 150 mbar with a holding time of two hours.

The process according to the invention is therefore suitable for producing solar modules; optionally, clouding can be removed by a downstream process stage.

Without further elaboration, it is believed that one skilled in the art can, using the preceding description, utilize the present invention to its fullest extent. The preceding preferred specific embodiments are, therefore, to be construed as merely illustrative, and not limitative of the remainder of the disclosure in any way whatsoever.

In the foregoing and in the examples, all temperatures are set forth uncorrected in degrees Celsius and, all parts and percentages are by weight, unless otherwise indicated.

The entire disclosures of all applications, patents and publications, cited herein and of corresponding German application No. 10 2007 005 845, filed Feb. 1, 2007, and U.S. Provisional Application Ser. No. 60/901,681, filed Feb. 16, 2007, are incorporated by reference herein.

The preceding examples can be repeated with similar success by substituting the generically or specifically described reactants and/or operating conditions of this invention for those used in the preceding examples.

From the foregoing description, one skilled in the art can easily ascertain the essential characteristics of this invention and, without departing from the spirit and scope thereof, can make various changes and modifications of the invention to adapt it to various usages and conditions.

The invention claimed is:

1. A method of producing a solar module comprising:
laminating a layer body comprising a first carrier, to which at least one solar cell unit is applied, and a second carrier, using at least one intermediate film based on a plasticizer-containing polyvinyl acetal positioned between said first carrier and said second carrier, wherein said laminating is performed by pressing the layer body between at least two pairs of rollers at a temperature of 50 to 150° C., wherein at least one of said first and second carriers is transparent, and wherein, after said pressing between said at least two pairs of rollers, the resultant pressed body is subjected to an increased or reduced pressure and an increased temperature,
wherein said at least two pairs of rollers operate at the same or different line pressures and at the same temperature, and wherein said at least two pairs of rollers comprises a lower pair of rollers and an upper pair of rollers, and the line pressure at the front and/or rear edge of the layer body is reduced to the dead weight of the upper pair of rollers.

2. The method according to claim 1, wherein said pressing between said at least two pairs of rollers is carried out at a line pressure of 0.5 N/mm to 100 N/mm.

3. The method according to claim 2, wherein said pressing between the roller pairs is carried out at a line pressure of 10 N/mm to 50 N/mm.

4. The method according to claim 1, wherein, prior to said pressing, said intermediate film based on plasticizer-containing polyvinyl acetal has a roughness value Rz of between 35 μm and 180 μm on one or both sides.

5. The method according to claim 1, wherein, prior to said pressing, said intermediate film based on plasticizer-containing polyvinyl acetal has a regular roughness structure.

6. The method according to claim 1, wherein, prior to said pressing, said intermediate film based on plasticizer-containing polyvinyl acetal has an irregular roughness structure.

7. The method according to claim 1, wherein said first carrier and/or second carrier consists of glass, plastic, metal or laminates thereof, laminated glazing, and/or insulating glass, provided that at least one of the carriers is transparent.

8. The method according to claim 1, wherein, after said pressing between said at least two pairs of rollers, the resultant pressed body is exposed to a reduced pressure of 0.01 to 300 mbar and a temperature of 100 to 200° C.

9. The method according to claim 1, wherein, after said pressing between said at least two pairs of rollers, the resultant pressed body is exposed to an increased pressure of 7 to 15 bar and a temperature of 130 to 145° C.

10. A method according to claim 1, wherein said layer body is pressed between said at least two pairs of rollers at a temperature of 60 to 150° C.

11. The method according to claim 10, wherein said pressing between said at least two pairs of rollers is carried out at a line pressure of 10 N/mm to 50 N/mm, and wherein, prior to said pressing, said intermediate film based on plasticizer-containing polyvinyl acetal has a roughness value Rz of > 50 μm to <150 μm on one or both sides.

12. The method according to claim 11, wherein, after said pressing between said at least two pairs of rollers, the resultant pressed body is exposed to either (a) a reduced pressure of 0.01 to 300 mbar and a temperature of 100 to 200° C., or (b) an increased pressure of 7 to 15 bar and a temperature of 130 to 145° C.

13. The method according to claim 1, wherein said layer body is heated, before being pressed, to a temperature of 50° C. to 150° C.

14. The method according to claim 1, wherein said intermediate film contains non-crosslinked polyvinyl butyral.

15. The method according to claim 1, wherein said intermediate film contains 50-85 weight % polyvinyl acetal and 50-20 weight % plasticizer.

16. The method according to claim 1, wherein said intermediate film contains 50-80 weight % polyvinyl acetal and 50-15 weight % by wt plasticizer.

17. The method according to claim 1, wherein said at least one solar cell unit is applied to a flexible carrier which is positioned between two of said intermediate films based on a plasticizer-containing polyvinyl acetal, and said intermediate films are positioned between said first carrier and second carrier.

18. The method according to claim 1, wherein a plurality of solar cell units are applied to said first carrier.

* * * * *